(12) United States Patent
Nakatsuka et al.

(10) Patent No.: US 7,391,282 B2
(45) Date of Patent: Jun. 24, 2008

(54) RADIO-FREQUENCY SWITCH CIRCUIT AND SEMICONDUCTOR DEVICE

(75) Inventors: Tadayoshi Nakatsuka, Toyonaka (JP); Masashi Miyagi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 195 days.

(21) Appl. No.: 11/280,247

(22) Filed: Nov. 17, 2005

(65) Prior Publication Data

US 2006/0103448 A1 May 18, 2006

(30) Foreign Application Priority Data

Nov. 17, 2004 (JP) .............................. 2004-332816

(51) Int. Cl.
*H01P 5/12* (2006.01)
*H04B 1/44* (2006.01)

(52) U.S. Cl. ........................ 333/103; 333/101
(58) Field of Classification Search ................. 333/101, 333/103, 104, 81 R; 455/78
See application file for complete search history.

(56) References Cited

U.S. PATENT DOCUMENTS

| | | | | |
|---|---|---|---|---|
| 5,774,792 | A | * | 6/1998 | Tanaka et al. .................. 455/78 |
| 6,118,985 | A | | 9/2000 | Kawakyu et al. |
| 2003/0141518 | A1 | | 7/2003 | Yokogawa et al. |
| 2003/0181167 | A1 | | 9/2003 | Iida |
| 2004/0061546 | A1 | | 4/2004 | Kushitani et al. |
| 2005/0047038 | A1 | | 3/2005 | Nakajima et al. |
| 2005/0159112 | A1 | | 7/2005 | Iida |
| 2005/0159113 | A1 | | 7/2005 | Iida |
| 2006/0261912 | A1 | * | 11/2006 | Miyagi et al. ................ 333/103 |

FOREIGN PATENT DOCUMENTS

| | | |
|---|---|---|
| JP | 08-23270 | 1/1996 |
| JP | 10-150395 | 6/1998 |
| JP | 11-46101 | 2/1999 |
| JP | 2000-295001 | 10/2000 |

(Continued)

OTHER PUBLICATIONS

Japanese Office Action issued in corresponding Japanese Patent Application No. JP 2005-321215, dated Sep. 11, 2006.

*Primary Examiner*—Dean O Takaoka
(74) *Attorney, Agent, or Firm*—McDermott Will & Emery LLP

(57) ABSTRACT

Switch sections composed of a plurality of FETs 111 to 118 and 121 to 128 connected in series are provided between input/output terminals 161 and 162 and ground terminals 181 and 182, and between the input/output terminals 161 to 163. A plurality of gate bias resistors 131 to 138, 141 to 148 are also provided. One terminal of each gate bias resistor is connected to a gate electrode of a corresponding one of the FETs 111 to 118 and 121 to 128, while a control voltage 171 and 172 for switching an ON state and an OFF state of the switch section is applied to the other terminal. Among the FETs included in each switch section, concerning the FETs 114, 115, 124, and 125 to which signal power is applied when the switch section is in the OFF state, the gate bias resistors 134, 135, 144, and 145 connected to the gate electrodes are set to have a highest resistance value.

16 Claims, 13 Drawing Sheets

FOREIGN PATENT DOCUMENTS

| JP | 2001-68984 | 3/2001 |
| JP | 2002-222817 | 8/2002 |
| JP | 2002-246942 | 8/2002 |
| JP | 2002-271103 | 9/2002 |
| JP | 2004-104394 | 4/2004 |

* cited by examiner

_US 7,391,282 B2_

RADIO-FREQUENCY SWITCH CIRCUIT AND SEMICONDUCTOR DEVICE

BACKGROUND OF THE INVENTION

1. Field of the Invention

The present invention relates to a radio-frequency switch circuit and a semiconductor device, and more particularly, to a radio-frequency switch circuit employing a field-effect transistor, and a semiconductor device in which the radio-frequency switch circuit is integrated.

2. Description of the Background Art

In recent years, as performance of mobile communication apparatuses is improved, there is an increasing demand for small-sized and high-performance radio-frequency semiconductor devices. Particularly, low insertion loss and low distortion are simultaneously required for a radio-frequency switch circuit which performs antenna switching. Therefore, a method of constructing a radio-frequency switch circuit using a plurality of field-effect transistors (hereinafter referred to as "FETs") connected together has been proposed.

FIG. 12 is a diagram illustrating a conventional radio-frequency switch circuit described in Japanese Patent Laid-Open Publication No. H08-23270. The conventional radio-frequency switch circuit of FIG. 12 comprises first to third input/output terminals 7 to 9, reception transfer FETs 11a and 11b, a transmission transfer FET 12, a reception shunt FET 21, transmission shunt FETs 22a and 22b, gate bias resistors 31a, 31b, 32a, 32b, 33, and 34 each of which has a resistance of R, and first and second control terminals 41 and 42. The conventional radio-frequency switch circuit is generally used while the first input/output terminal 7 is used as a reception terminal, the second input/output terminal 8 is used as a transmission terminal, and the third input/output terminal 9 is used as an antenna terminal.

In order to receive a radio-frequency signal, a high voltage is applied to the first control terminal 41 while a low voltage is applied to the second control terminal 42. Thereby, the FETs 11a, 11b, 22a, and 22b are turned ON while the FETs 12 and 21 are turned OFF, so that the first input/output terminal 7 and the third input/output terminal 9 are short-circuited. Therefore, the received signal input from the third input/output terminal 9 is output from the first input/output terminal 7.

In order to transmit a radio-frequency signal, a low voltage is applied to the first control terminal 41 while a high voltage is applied to the second control terminal 42. Thereby, the FETs 11a, 11b, 22a, and 22b are turned OFF while the FETs 12 and 21 are turned ON, so that the second input/output terminal 8 and the third input/output terminal 9 are short-circuited. Therefore, the transmission signal input from the second input/output terminal 8 is output from the third input/output terminal 9.

In the conventional radio-frequency switch circuit, the two FETs 11a and 11b are connected in series for the purpose of reception transfer, and the two FETs 22a and 22b are connected in series for transmission shunt. Therefore, during transmission, the radio-frequency signal voltage input from the second input/output terminal 8 is divided by the FETs 11a, 11b, 22a, and 22b. As a result, even when a large signal is input from the second input/output terminal 8, the FETs 11a, 11b, 22a, and 22b can easily maintain the OFF state, so that excellent distortion characteristics and high input satuation power can be achieved as compared to when only one FET is used.

In the conventional radio-frequency switch circuit, the gate bias resistors 31a, 31b, 32a, 32b, 33, and 34 are provided for the purpose of prevention of leakage of the radio-frequency signal. Connection to the gate electrode of each of the two series-connected FETs of FIG. 12 requires the resistance R of about 40 to 50 kΩ in order to prevent degradation of performance due to signal leakage. The same applies to a radio-frequency switch circuit of FIG. 13 in which two or more FETs are connected in series, i.e., a plurality of resistors having the same resistance R are used to construct the radio-frequency switch circuit of FIG. 13.

In the conventional radio-frequency switch circuits of FIGS. 12 and 13, resistors having the same value R of as large as about 40 to 50 kΩ are used for all gate bias resistors connected to the gates of FETs. However, it is difficult to use a material having a large sheet resistance in a semiconductor process. Therefore, when resistance elements of about 40 to 50 kΩ are formed on a semiconductor substrate, the resistance elements occupy a large area on the substrate. Therefore, the chip size of the conventional radio-frequency switch circuit increases, resulting in high circuit cost.

SUMMARY OF THE INVENTION

Therefore, an object of the present invention is to provide a small-size and high-performance radio-frequency switch circuit without a degradation in performance due to signal leakage and an increase in chip size, and a semiconductor device employing the radio-frequency switch circuit.

The present invention is directed to a radio-frequency switch circuit for controlling flow of a radio-frequency signal, and a semiconductor device employing the radio-frequency switch circuit. In order to achieve the above-described object, the radio-frequency switch circuit of the present invention has the following structure comprising a plurality of field-effect transistors and a plurality of resistance elements having resistance values under predetermined conditions. Note that a plurality of field-effect transistors can be replaced with a single multigate field-effect transistor.

A plurality of field-effect transistors are connected in series between an input/output terminal and a ground terminal, a radio-frequency signal being input and output through the input/output terminal, and a plurality of resistance elements are provided. Each of the plurality of resistance elements has two terminals. One of the two terminals is connected to a gate electrode of a corresponding one of the plurality of field-effect transistors, and a control voltage for switching an ON state and an OFF state of the corresponding field-effect transistor is applied to the other of the two terminals. In this case, one of the plurality of resistance elements connected to a gate electrode of one of the plurality of field-effect transistors connected to the input/output terminal is designed to have a highest resistance value among the plurality of resistance elements.

In this case, when first to n-th (n is an integer of 2 or more) field-effect transistors are connected in series and in order of first to n-th between from the input/output terminal to the ground terminal, resistance values Rgs(1) to Rgs(n) of first to n-th resistance elements connected to gate electrodes of the first to n-th field-effect transistors are preferably set based on Rgs(1)>Rgs(2)≧ . . . ≧Rgs(n−1)≧Rgs(n).

Alternatively, a plurality of field-effect transistors are connected in series between two input/output terminals, a radio-frequency signal being input and output through the input/output terminals, and a plurality of resistance elements are provided. Each of the plurality of resistance elements has two terminals. One of the two terminals is connected to a gate electrode of a corresponding one of the plurality of field-effect transistors, and a control voltage for switching an ON state and an OFF state of the corresponding field-effect transistor is applied to the other of the two terminals. In this case, one of the plurality of resistance elements connected to a gate electrode of one of the plurality of field-effect transistors connected to an OFF active input/output terminal is designed to have a highest resistance value among the plurality of resistance elements, the OFF active input/output terminal being one of the two input/output terminals to which signal power is input when the plurality of field-effect transistors are in an OFF state.

In this case, when first to m-th (m is an integer of 2 or more) field-effect transistors are connected in series and in order of first to m-th between from the OFF active input/output terminal to the other input/output terminal, resistance values $Rg(1)$ to $Rg(m)$ of first to m-th resistance elements connected to gate electrodes of the first to m-th field-effect transistors are preferably set based on $Rg(1)>Rg(2)\geq \ldots \geq Rg(m-1)\geq Rg(m)$.

Further, the structure in which a plurality of field-effect transistors are connected in series between an input/output terminal and a ground terminal and the structure in which a plurality of field-effect transistors are connected in series between two input/output terminals, can be combined in one or more.

These radio-frequency switch circuits can be each integrated on a semiconductor substrate.

According to the above-described present invention, concerning the resistance values of a plurality of resistance elements connected to the gate electrodes of a plurality of field-effect transistors connected in series or a multigate field-effect transistor, only a resistance element connected to a gate electrode closest to an input/output terminal to which a radio-frequency signal is input is set to be a highest value. Thereby, the radio-frequency switch circuit of the present invention can have a significantly reduced footprint (chip size) on a semiconductor substrate while keeping the same performance as that of conventional radio-frequency switch circuits.

These and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
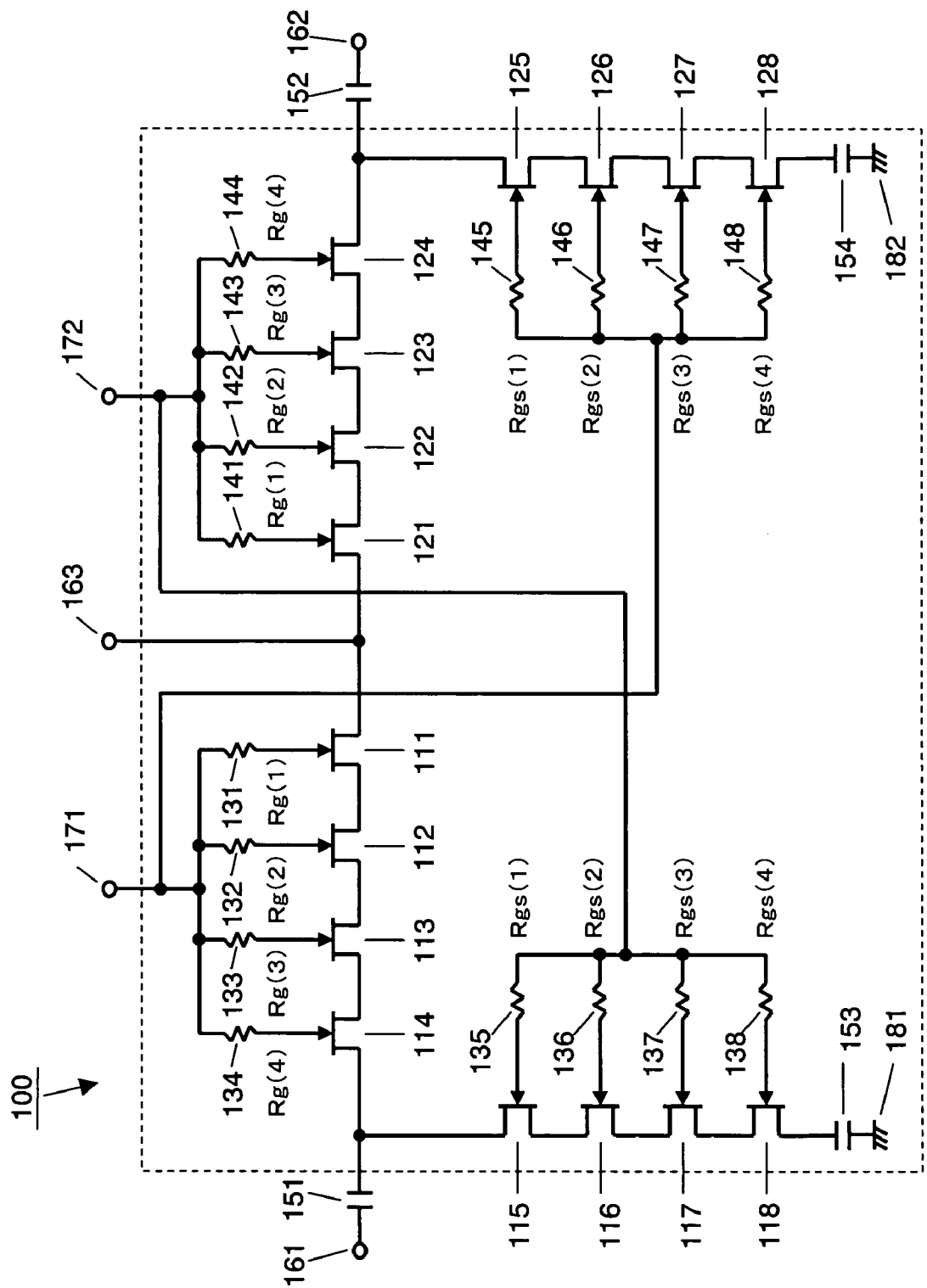
FIG. 1 is a diagram illustrating a radio-frequency switch circuit 100 according to a first embodiment of the present invention.

FIG. 1 is a diagram illustrating a radio-frequency switch circuit 100 according to a first embodiment of the present invention. The radio-frequency switch circuit 100 of FIG. 1 is composed of four groups of FETs connected in series, and functions as a Single Pole Double Throw (SPDT) circuit. The radio-frequency switch circuit 100 comprises FETs 111 to 118 and 121 to 128, gate bias resistors 131 to 138 and 141 to 148, capacitors 151 to 154, first to third input/output terminals 161 to 163, first and second control terminals 171 and 172, and ground terminals 181 and 182. The first to third input/output terminal 161 to 163 are terminals for inputting/outputting a radio-frequency signal.

In FIG. 1, the FETs 111 to 114 constitute a first switch section, and are connected in series between the third input/output terminal 163 and the first input/output terminal 161. The FETs 115 to 118 constitute a second switch section, and are connected in series between the first input/output terminal 161 and the ground terminal 181. The FETs 121 to 124 constitute a third switch section, and are connected in series between the third input/output terminal 163 and the second input/output terminal 162. The FETs 125 to 128 constitute a fourth switch section, and are connected in series between the second input/output terminal 162 and the ground terminal 182. Although each switch section is composed of four FETs in the first embodiment, the number of FETs is not particularly limited as long as it is plural.

The first and third switch sections which are inserted between input/output terminals and in series with respect to a signal transmission path, function as transfer circuits which switch ON/OFF (passage/interruption) of flow of a radio-frequency signal. On the other hand, the second and fourth switch sections which are inserted between an input/output terminal and a ground terminal and in parallel with respect to a signal transmission path, function as shunt circuits which cause a leakage signal to escape to the ground. Thus, the radio-frequency switch circuit 100 is composed of a combination of two transfer circuits and two shunt circuits.

Hereinafter, an operation of the thus-constructed radio-frequency switch circuit 100 will be described.

In order to transfer a radio-frequency signal from the first input/output terminal 161 to the third input/output terminal 163, a high voltage (e.g., 3 V) is applied to the first control terminal 171 while a low voltage (e.g., 0 V) is applied to the second control terminal 172. By applying these voltages in this manner, the FETs 111 to 114 and 125 to 128 are turned ON while the FETs 115 to 118 and 121 to 124 are turned OFF, so that the first input/output terminal 161 and the third input/output terminal 163 are short-circuited. Therefore, the radio-frequency signal input from the first input/output terminal 161 is transferred to the third input/output terminal 163. By contrast, in order to transfer a radio-frequency signal from the second input/output terminal 162 to the third input/output terminal 163, a low voltage is applied to the first control terminal 171 while a high voltage is applied to the second control terminal 172. By applying these voltages in this manner, the FETs 111 to 114 and 125 to 128 are turned OFF while the FETs 115 to 118 and 121 to 124 are turned ON, so that the second input/output terminal 162 and the third input/output terminal 163 are short-circuited. Therefore, the radio-frequency signal input from the second input/output terminal 162 is transferred to the third input/output terminal 163.

Figure 2:
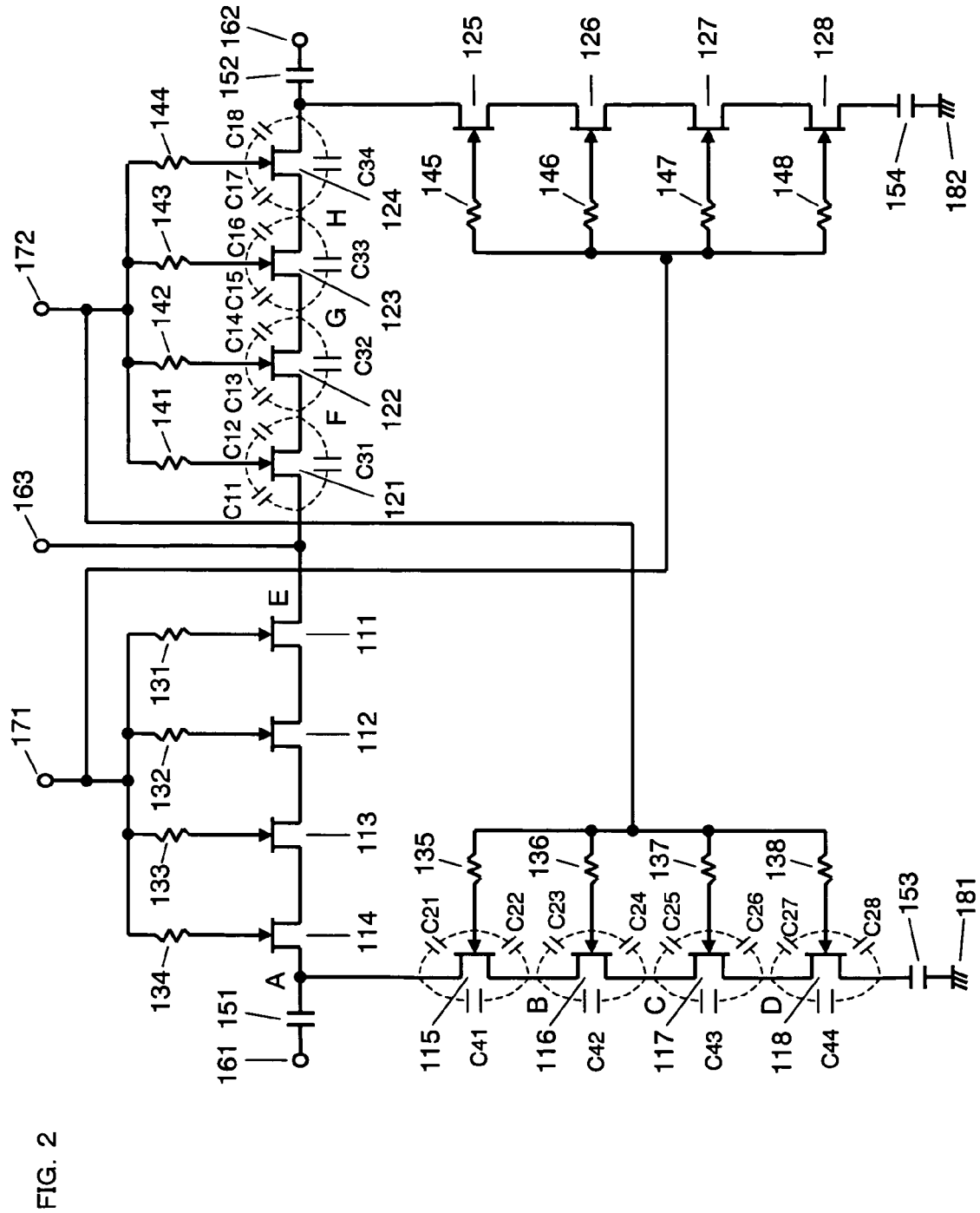
FIG. 2 is a diagram illustrating capacitance components of OFF-state FETs in the radio-frequency switch circuit 100.

Next, an operation of the radio-frequency switch circuit 100 in which a stray capacitance of a FET is taken into consideration, will be described. FIG. 2 is a diagram illustrating capacitance components of OFF-state FETs in the radio-frequency switch circuit 100. FIG. 2 indicates stray capacitance components C11 to C18 and C21 to C28 which occur in the OFF-state FETs 115 to 118 and 121 to 124 when a radio-frequency signal is transferred from the first input/output terminal 161 to the third input/output terminal 163. Note that a theory similar to that described below is also applicable to the OFF-state FETs 111 to 114 and 125 to 128 when a radio-frequency signal is transferred from the second input/output terminal 162 to the third input/output terminal 163.

In order to transfer a radio-frequency signal from the first input/output terminal 161 to the third input/output terminal 163, the FETs 111 to 114 and 125 to 128 are controlled to be turned ON while the FETs 115 to 118 and 121 to 124 are controlled to be turned OFF as described above. In this case, a voltage of the radio-frequency signal input from the first input/output terminal 161 is divided by the stray capacitances C11 to C18 and C21 to C28 of the OFF-state FETs. Therefore, voltages at points B, C, and D of FIG. 2 are respectively ¾, 2/4, and ¼ times larger than a voltage at point A. Voltages at points F, G, and H of FIG. 2 are ¾, 2/4, and ¼ times larger than a voltage at point E. In other words, the farther the distance from a signal path, the smaller the voltage applied to the FET. In addition, the degree of influence on the signal path decreases in proportion to a reduction in the voltage. Therefore, values of the gate bias resistors (resistance elements) 135 to 138 and 141 to 144 can be reduced, depending on the degree of the influence on the signal path.

Therefore, in the radio-frequency switch circuit 100 of the first embodiment of the present invention, concerning the gate bias resistors 135 to 138 of the FETs 115 to 118 constituting a shunt circuit, only a resistance value Rgs(1) of the gate bias resistor 135 closest to the input/output terminal 161 to which radio-frequency signal power is applied is set to be a highest value, and resistance values Rgs(2) to Rgs(4) of the other gate bias resistors 136 to 138 are set to be smaller than the highest value. By setting the resistance values of the gate bias resistors 135 to 138 in this manner, the influence on the signal path can be reduced while minimizing the total value of the resistance values.

In this case, it is preferable that the resistance values Rgs(1) to Rgs(4) of the gate bias resistors 135 to 138 be gradually reduced with an increase in distance from the input/output terminal 161. For example, the resistance values Rgs(1) to Rgs(4) are set to be 40 kΩ, 30 kΩ, 20 kΩ, and 10 kΩ, respectively. Note that the resistance values do not need to be in an arithmetic or geometric progression. Concerning the resistance values Rgs(2) to Rgs(4), a part or the whole of them may be the same resistance value. For example, the resistance values Rgs(1) to Rgs(4) may be set to be 40 kΩ, 20 kΩ, 20 kΩ, and 10 kΩ, respectively.

The above-described conditions for setting the resistance value Rgs(1) to Rgs(4) are generalized by expression 1 below. Expression 1 provides conditions for setting resistance values Rgs(1) to Rgs(n) of first to n-th gate bias resistors connected to the gate electrodes of first to n-th FETs which are connected in series and in order of first to n-th between an input/output terminal to a ground terminal (n: an integer of 2 or more).

$$Rgs(1) > Rgs(2) \geq \ldots \geq Rgs(n-1) \geq Rgs(n) \qquad 1$$

Further, in the radio-frequency switch circuit 100 of the first embodiment of the present invention, concerning the gate bias resistors 141 to 144 of the FETs 121 to 124 constituting a transfer circuit, only a resistance value Rg(1) of the gate bias resistor 141 which is closest to an input/output terminal (hereinafter referred to as an off active input/output terminal) 161 to which radio-frequency signal power is applied when the transfer circuit is in the OFF state is set to be a highest value, and resistance values Rg(2) to Rg(4) of the other gate bias resistors 142 to 144 are set to be smaller than the highest value. By setting the resistance values of the gate bias resistors 141 to 144 in this manner, the influence on the signal path can be reduced while minimizing the total value of the resistance values.

Also in this case, it is preferable that the resistance value Rg(1) to Rg(4) of the gate bias resistors 141 to 144 be set to be gradually reduced with an increase in distance from the off active input/output terminal 161. For example, the resistance values Rg(1) to Rg(4) are set to be 50 kΩ, 40 kΩ, 30 kΩ, and 20 kΩ, respectively. Note that the resistance values do not need to be in an arithmetic or geometric progression. Concerning the resistance values Rg(2) to Rg(4), a part or the whole of them may be the same resistance value. For example, the resistance values Rg(1) to Rg(4) may be set to be 50 kΩ, 30 kΩ, 20 kΩ, and 20 kΩ, respectively.

The above-described conditions for setting the resistance value Rg(1) to Rg(4) are generalized by expression 2 below. Expression 2 provides conditions for setting resistance values Rg(1) to Rg(m) of first to m-th gate bias resistors connected to the gate electrodes of first to m-th FETs which are connected in series and in order of first to m-th between an off active input/output terminal to the other input/output terminal (m: an integer of 2 or more).

$$Rg(1) > Rg(2) \geq \ldots \geq Rg(m-1) \geq Rg(m) \qquad 2$$

Even when the resistance values of the gate bias resistors are set under the above-described conditions, the radio-frequency switch circuit 100 of the present invention has a significantly reduced footprint (chip size) on a substrate while keeping the same performance as that of conventional radio-frequency switch circuits. This will be described below with reference to FIGS. 3A, 3B, 4, and 5.

Figure 3A:
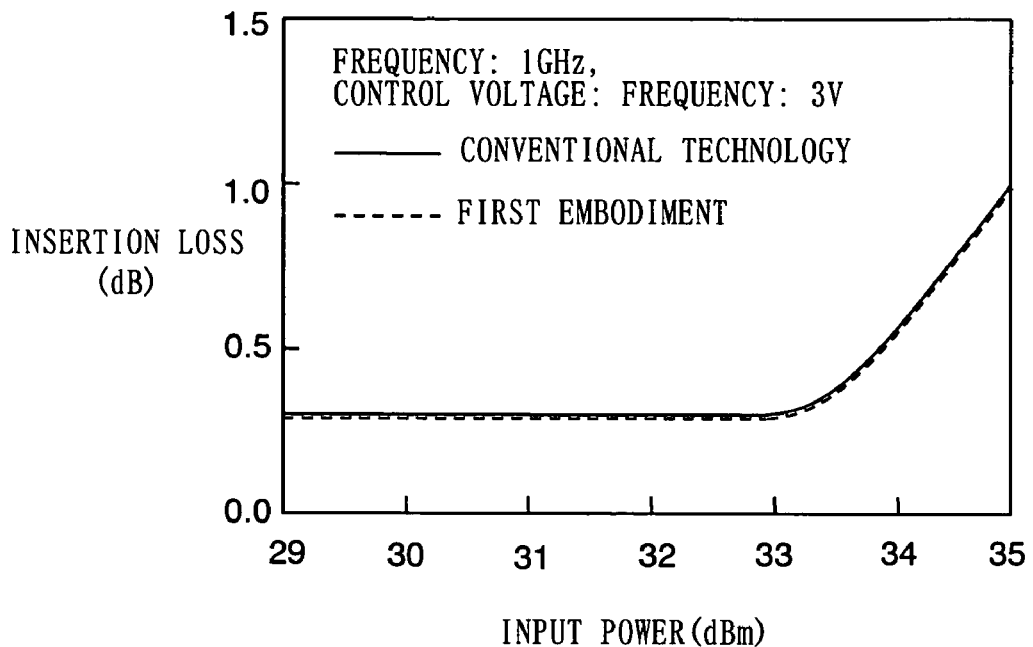
FIG. 3A is a diagram illustrating input power dependency of insertion loss of the radio-frequency switch circuit 100.
Figure 3B:
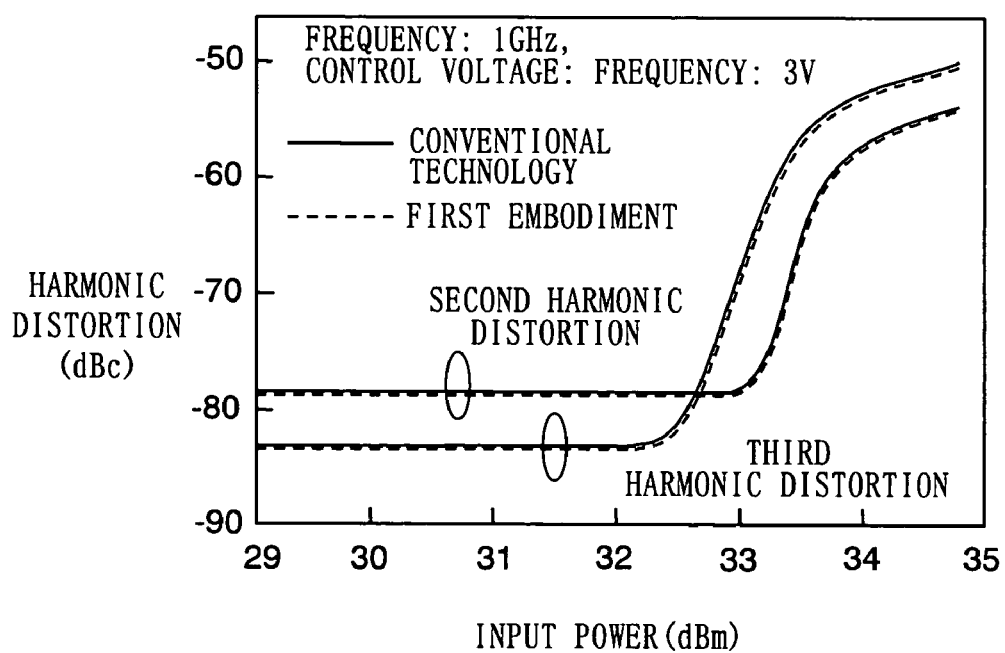
FIG. 3B is a diagram illustrating input power dependency of harmonic distortion of the radio-frequency switch circuit 100.

FIG. 3A is a diagram illustrating input power dependency of insertion loss of the radio-frequency switch circuit 100. FIG. 3B is a diagram illustrating input power dependency of harmonic distortion of the radio-frequency switch circuit 100.

Note that, in the radio-frequency switch circuit 100, characteristics thereof when a path from the first input/output terminal 161 to the third input/output terminal 163 is valid are the same as characteristics thereof when a path from the second input/output terminal 162 to the third input/output terminal 163 is valid. Therefore, the results illustrated in FIGS. 3A and 3B correspond to either of these characteristics.

In FIG. 3A, the vertical axis indicates insertion loss and the horizontal axis indicates input power. As can be seen from FIG. 3A, when input power is low, the insertion loss of the radio-frequency switch circuit 100 is the same as that of conventional radio-frequency switch circuits (about 0.3 dB). Input power at which the insertion loss starts to increase in the radio-frequency switch circuit 100 is the same as that of conventional radio-frequency switch circuits (about 33 dBm).

Also in FIG. 3B, the vertical axis indicates harmonic distortion and the horizontal axis indicates input power. As can be seen from FIG. 3B, when input power is low, second and third harmonic distortion of the radio-frequency switch circuit 100 are the same as those of conventional radio-frequency switch circuits (second harmonic distortion: about −78 dBc, third harmonic distortion: about −83 dBc). Also, input powers at which second and third harmonic distortion start to increase in the radio-frequency switch circuit 100 are the same as those of conventional radio-frequency switch circuits (second harmonic distortion: about 33 dBm, third harmonic distortion: about 32 dBm).

Figure 4:
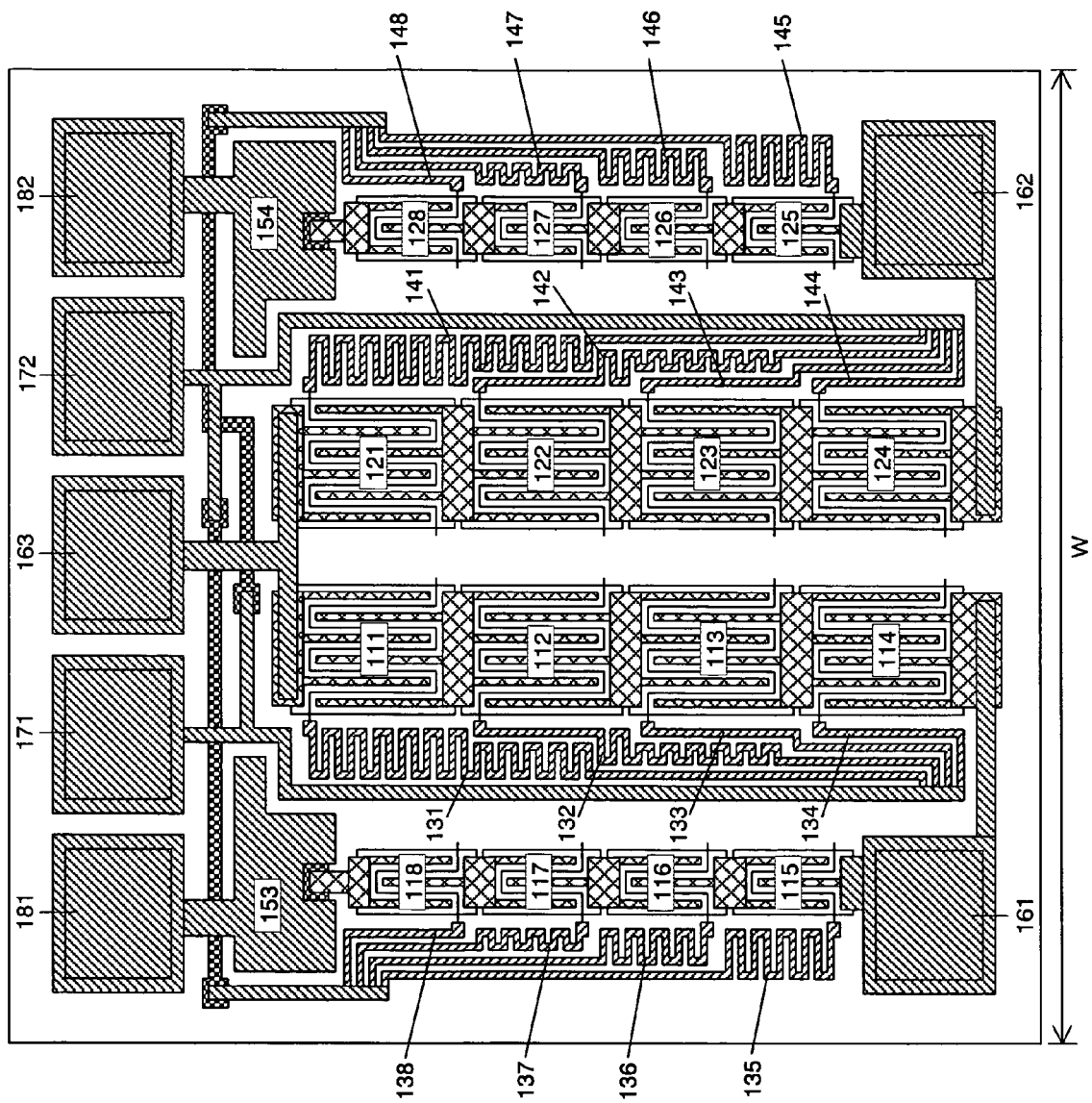
FIG. 4 is a diagram illustrating a result of integration of the radio-frequency switch circuit 100 on a semiconductor substrate.
Figure 5:
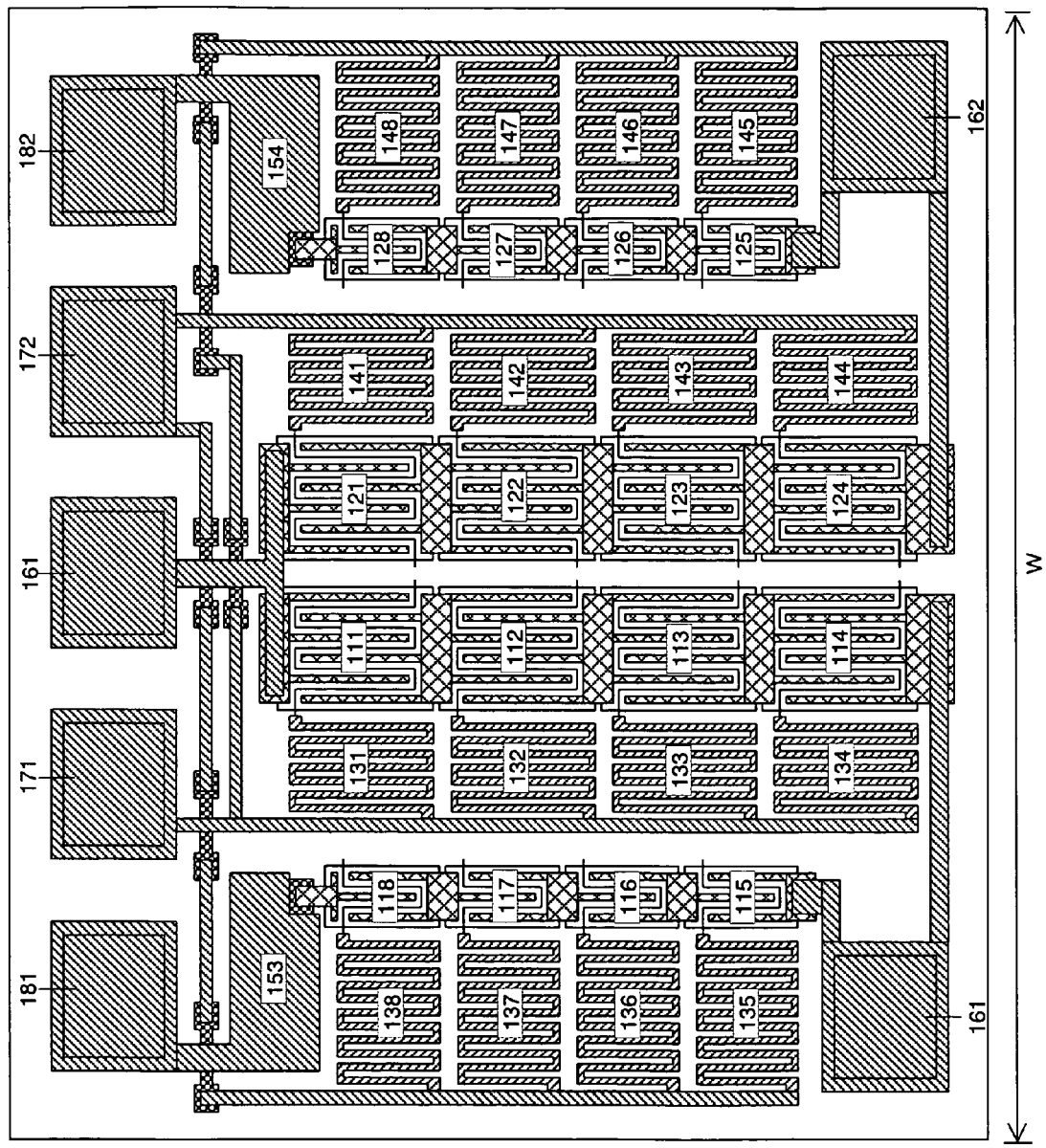
FIG. 5 is a diagram illustrating a result of integration of a conventional radio-frequency switch circuit on a semiconductor substrate.

FIG. 4 is a diagram illustrating a result of integration of a major portion of the radio-frequency switch circuit 100 (a portion enclosed with a dashed line and seven terminals in FIG. 1) on a semiconductor substrate. FIG. 5 is a diagram illustrating a result of integration of a major portion of a conventional radio-frequency switch circuit (i.e., a radio-frequency switch circuit having the same structure as that of the radio-frequency switch circuit 100, and has resistance elements having the same resistance value R with respect to gate bias resistors) on a semiconductor substrate under the same design rule as that of FIG. 4. Note that the same elements are indicated with the same reference numerals in FIGS. 1, 4, and 5.

As can be seen from comparison between FIGS. 4 and 5, the areas of the gate bias resistors 131 to 138 and 141 to 148 of the radio-frequency switch circuit 100 are smaller than those of the conventional radio-frequency switch circuit. Therefore, by using the radio-frequency switch circuit 100, the chip size can be reduced by about 20% from that of the conventional radio-frequency switch circuit (a horizontal width W is reduced).

As described above, in the radio-frequency switch circuit 100 of the first embodiment of the present invention, concerning the resistance values of a plurality of gate bias resistors connected to gate electrodes of a plurality of FETs connected in series, only a gate bias resistor connected to a gate electrode closest to an input/output terminal to which a radio-frequency signal is input is set to be a highest value. Thereby, the radio-frequency switch circuit 100 of the first embodiment of the present invention can have a significantly reduced footprint (chip size) on a semiconductor substrate while keeping the same performance as that of conventional radio-frequency switch circuits.

Second Embodiment

Figure 6:
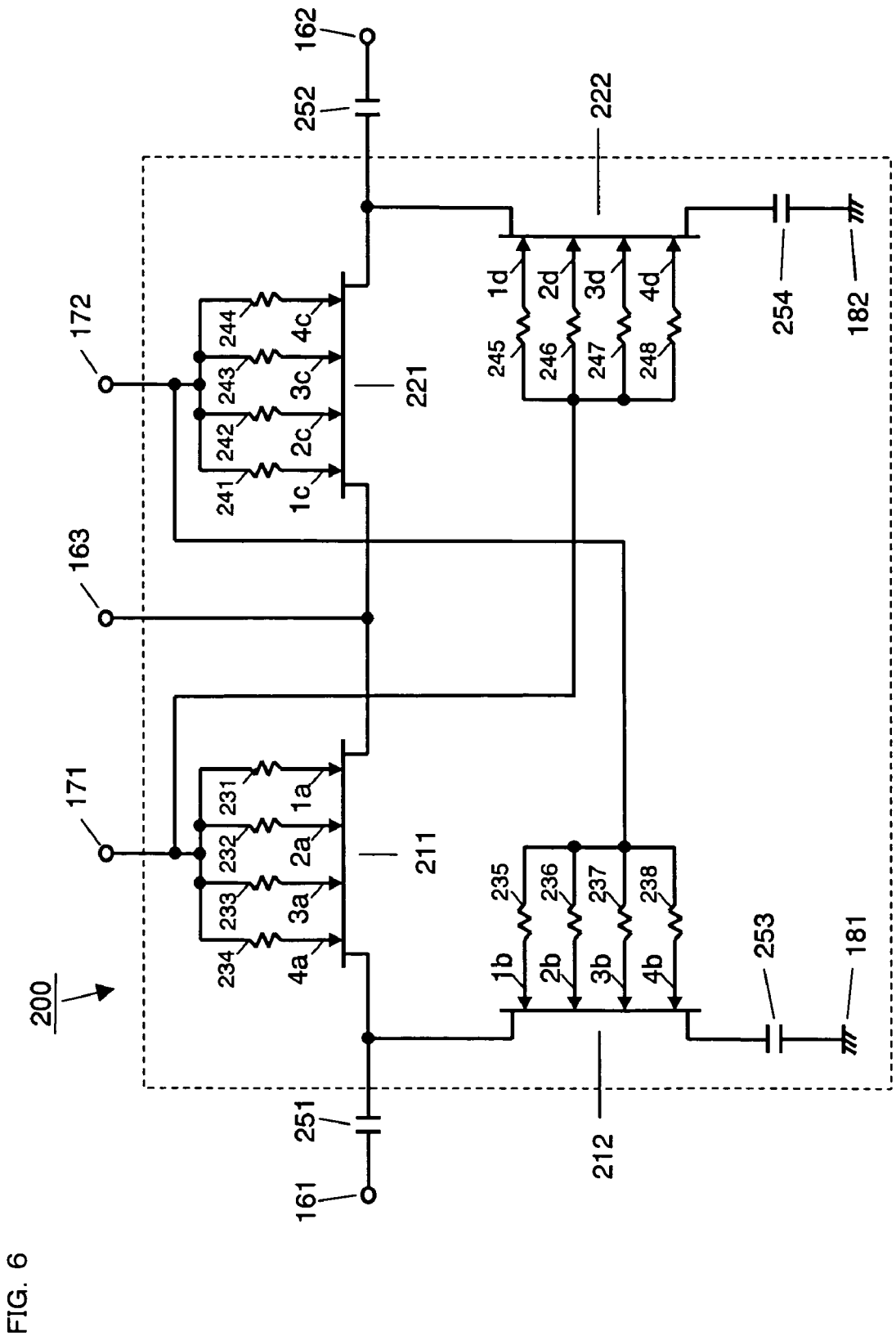
FIG. 6 is a diagram illustrating a radio-frequency switch circuit 200 according to a second embodiment of the present invention.

FIG. 6 is a diagram illustrating a radio-frequency switch circuit 200 according to a second embodiment of the present invention. The radio-frequency switch circuit 200 of FIG. 6 is composed of four multigate FETs, and functions as an SPDT circuit. The radio-frequency switch circuit 200 comprises multigate FETs 211, 212, 221, and 222, gate bias resistors 231 to 238 and 241 to 248, capacitors 251 to 254, first to third input/output terminals 161 to 163, first and second control terminals 171 and 172, and ground terminals 181 and 182.

As can be seen from FIG. 6, the radio-frequency switch circuit 200 of the second embodiment of the present invention is different from the radio-frequency switch circuit 100 of the first embodiment of the present invention in that the first to fourth switch sections are each composed of one multigate FET. The multigate FET is known to have a plurality of gate electrodes (1a to 4a, 1b to 4b, 1c to 4c, and 1d to 4d in the example of FIG. 6), and has a structure equivalent to that in which a plurality of FETs each having one gate electrode are connected in series. The multigate FETs 211 and 221, which are inserted between input/output terminals and in series with respect to a signal transmission path, function as transfer circuits which switch ON/OFF (passage/interruption) of flow of a radio-frequency signal. The multigate FETs 212 and 222, which are inserted between an input/output terminal and a ground terminal and in parallel with respect to a signal transmission path, function as shunt circuits which cause a leakage signal to escape to the ground.

Thus, the radio-frequency switch circuit 200 of the second embodiment of the present invention is composed of a combination of two transfer circuits and two shunt circuits, each of which is composed of a multigate FET, as is similar to the radio-frequency switch circuit 100 of the first embodiment of the present invention. Therefore, when a radio-frequency signal is transferred from the first input/output terminal 161 to the third input/output terminal 163, and when a radio-frequency signal is transferred from the second input/output terminal 162 to the third input/output terminal 163, stray capacitance possessed by a multigate FET in the OFF state is considered in the same way.

Hereinafter, the radio-frequency switch circuit 200 will be described, mainly concerning a difference from the radio-frequency switch circuit 100.

In order to transfer a radio-frequency signal from the first input/output terminal 161 to the third input/output terminal 163, a high voltage is applied to the first control terminal 171 while a low voltage is applied to the second control terminal 172. By applying these voltages in this manner, the multigate FETs 211 and 222 are turne ON while the multigate FETs 212 and 221 are turned OFF, so that the first input/output terminal 161 and the third input/output terminal 163 are short-circuited. Therefore, the radio-frequency signal input from the first input/output terminal 161 is transferred to the third input/output terminal 163. By contrast, in order to transfer a radio-frequency signal from the second input/output terminal 162 to the third input/output terminal 163, a low voltage is applied to the first control terminal 171 while a high voltage is applied to the second control terminal 172. By applying these voltages in this manner, the multigate FETs 211 and 222 are turned OFF while the multigate FETs 212 and 221 are turned ON, so that the second input/output terminal 162 and the third input/output terminal 163 are short-circuited. Therefore, the radio-frequency signal input from the second input/output terminal 162 is transferred to the third input/output terminal 163.

Also in the radio-frequency switch circuit 200, as is similar to the radio-frequency switch circuit 100, a voltage applied to a gate electrode decreases with an increase in distance from a signal path, while the degree of influence on the signal path decreases in proportion to a decrease in the voltage. Therefore, the values of the gate bias resistors 231 to 238 and 241 to 248 can be reduced, depending on the degree of the influence on the signal path.

Therefore, in the radio-frequency switch circuit 200 of the second embodiment of the present invention, concerning the gate bias resistors 235 to 238 of the multigate FET 212 constituting a shunt circuit, only a resistance value Rgs(1) of the gate bias resistor 235 closest to the input/output terminal 161 to which radio-frequency signal power is applied is set to be a highest value, while resistance values Rgs(2) to Rgs(4) of the other gate bias resistors 236 to 238 are set to be smaller than the highest value. Thus, by setting the resistance values of the gate bias resistors 235 to 238 in this manner, the influence on the signal path can be reduced while minimizing the total value of the resistance values. Also in this case, the resistance values Rgs(1) to Rgs(4) of the gate bias resistors 235 to 238 are preferably set to be gradually reduced with an increase in distance from the input/output terminal 161 in accordance with the above-described expression 1. The same applies to the gate bias resistors 245 to 248.

In addition, in the radio-frequency switch circuit 200 of the second embodiment of the present invention, concerning the gate bias resistors 241 to 244 of the FET 221 constituting a transfer circuit, only a resistance value Rg(1) of the gate bias resistor 241 closest to the off active input/output terminal 161 is set to be a highest value, while resistance values Rg(2) to Rg(4) of the other gate bias resistor 242 to 244 are set to be smaller than the highest value. By setting the resistance values of the gate bias resistors 241 to 244 in this manner, the influence on the signal path can be reduced while minimizing the total value of the resistance values. Also in this case, the resistance values Rg(1) to Rg(4) of the gate bias resistors 241 to 244 are preferably set to be gradually reduced with an increase in distance from the off active input/output terminal 161 in accordance with the above-described expression 2. The same applies to the gate bias resistors 231 to 234.

Figure 7A:
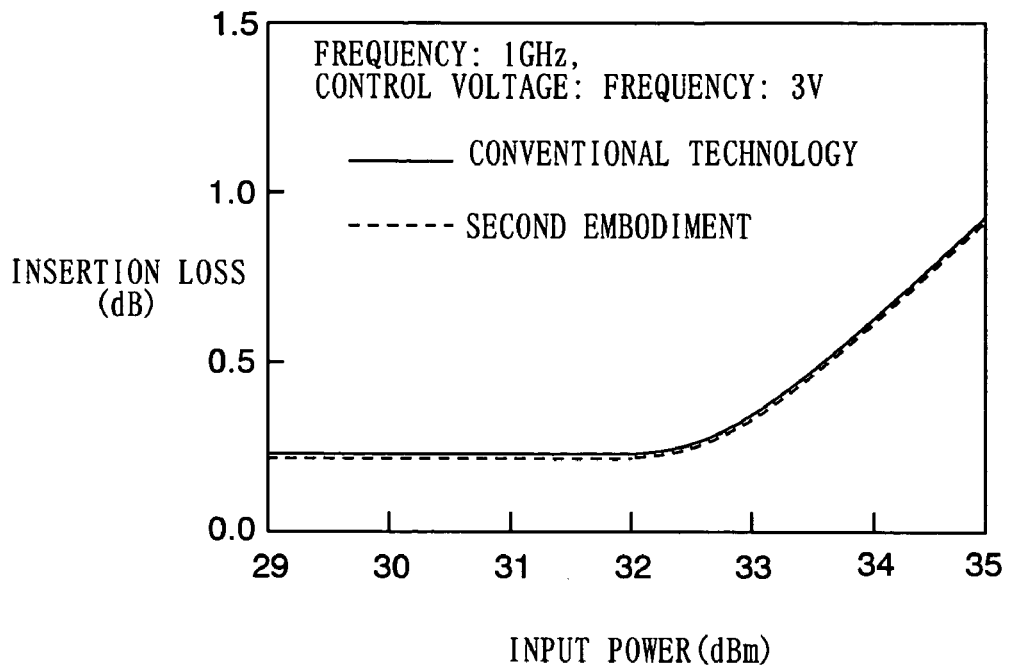
FIG. 7A is a diagram illustrating input power dependency of insertion loss of the radio-frequency switch circuit 200.
Figure 7B:
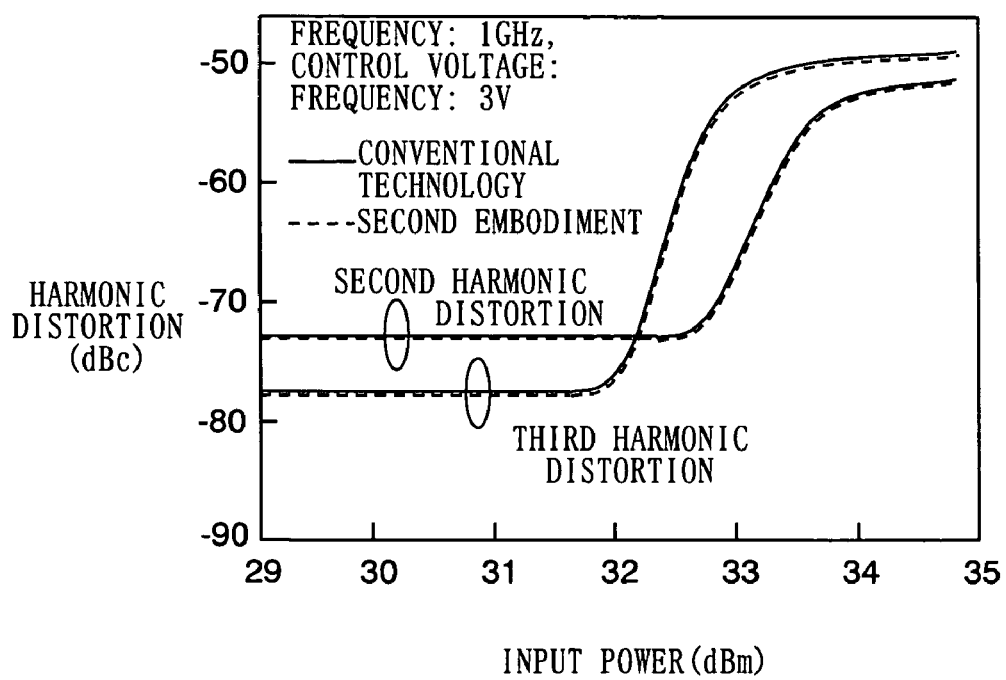
FIG. 7B is a diagram illustrating input power dependency of harmonic distortion of the radio-frequency switch circuit 200.

FIGS. 7A and 7B illustrate characteristics of the radio-frequency switch circuit 200 corresponding to FIGS. 3A and 3B. FIG. 7A is a diagram illustrating input power dependency of insertion loss of the radio-frequency switch circuit 200. FIG. 7B is a diagram illustrating input power dependency of harmonic distortion of the radio-frequency switch circuit 200.

As can be seen from FIG. 7A, when input power is low, the insertion loss of the radio-frequency switch circuit 200 is the same as that of conventional radio-frequency switch circuits (about 0.3 dB). Input power at which the insertion loss starts to increase in the radio-frequency switch circuit 200 is the same as that of conventional radio-frequency switch circuits (about 33 dBm). Also, as can be seen from FIG. 7B, when input power is low, second and third harmonic distortion of the radio-frequency switch circuit 200 are the same as those of conventional radio-frequency switch circuits (second harmonic distortion: about −78 dBc, third harmonic distortion: about −83 dBc). Also, input powers at which second and third harmonic distortion start to increase in the radio-frequency switch circuit 200 are the same as those of conventional radio-frequency switch circuits (second harmonic distortion: about 33 dBm, third harmonic distortion: about 32 dBm).

Figure 8:
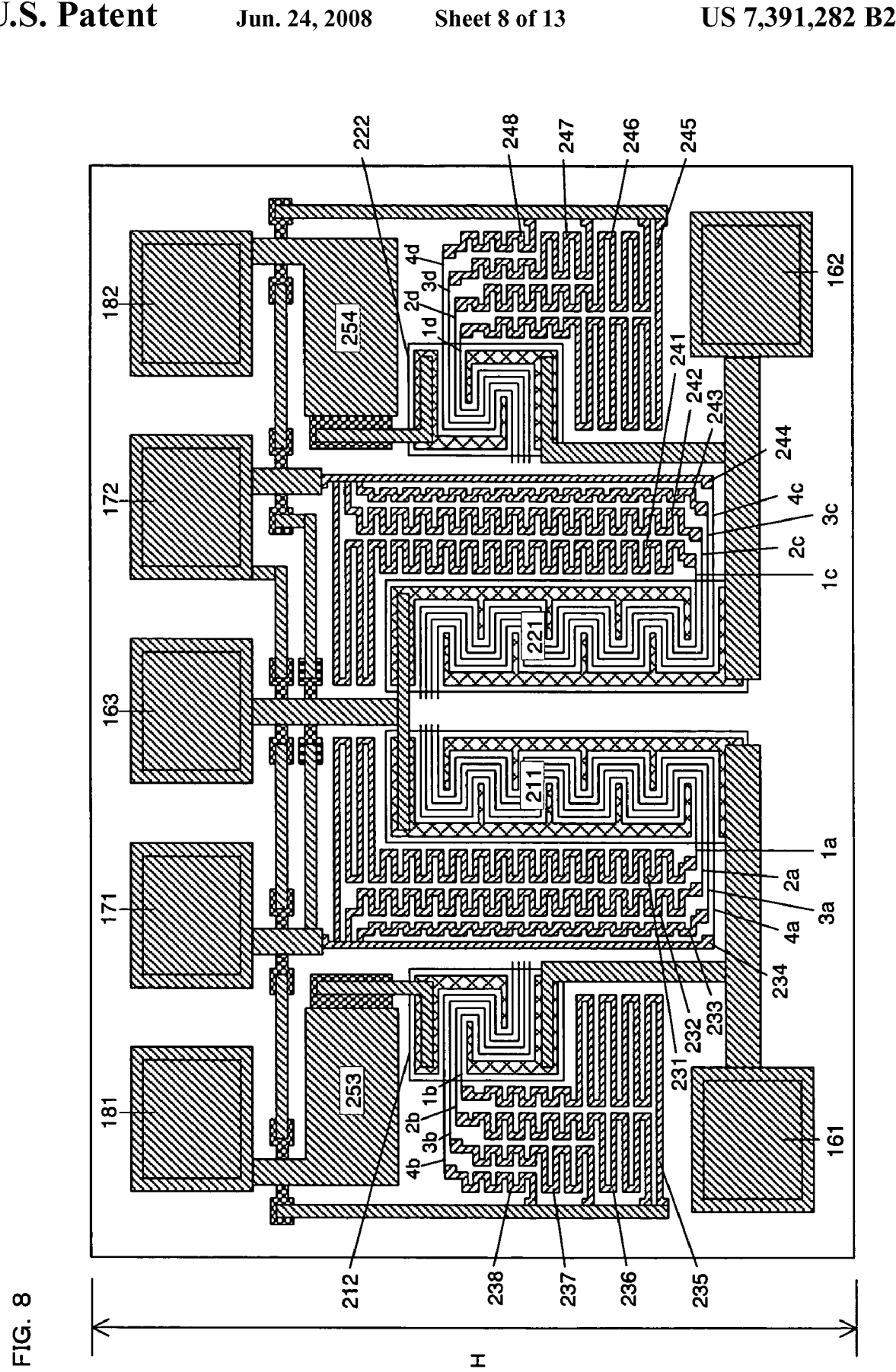
FIG. 8 is a diagram illustrating a result of integration of the radio-frequency switch circuit 200 on a semiconductor substrate.
Figure 9:
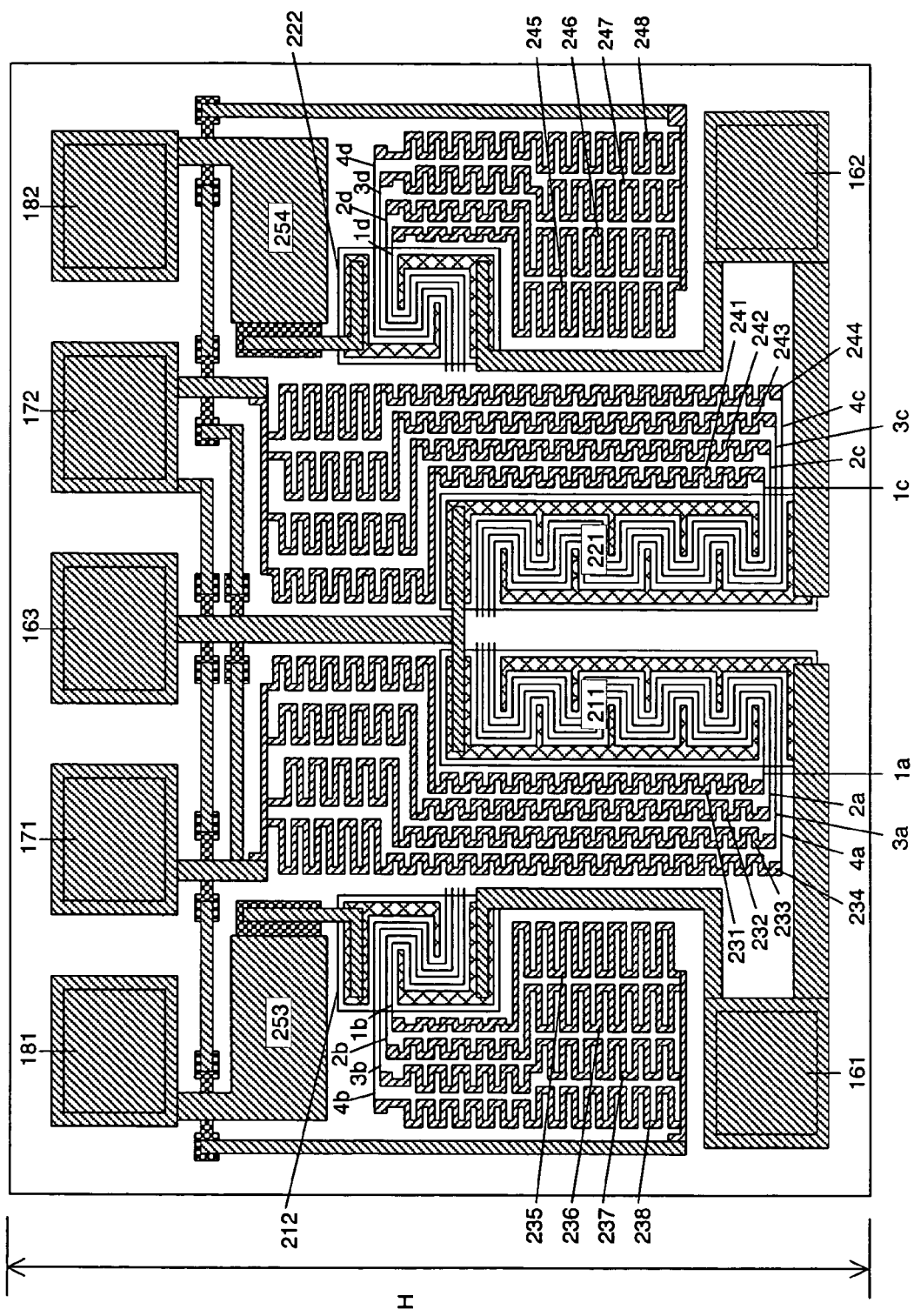
FIG. 9 is a diagram illustrating a result of integration of a conventional radio-frequency switch circuit on a semiconductor substrate.

FIG. 8 is a diagram illustrating a result of integration of a major portion of the radio-frequency switch circuit 200 (a portion enclosed with a dashed line and seven terminals in FIG. 6) on a semiconductor substrate. FIG. 9 is a diagram illustrating a result of integration of a major portion of a conventional radio-frequency switch circuit (i.e., a radio-frequency switch circuit having the same structure as that of the radio-frequency switch circuit 200, and has resistance elements having the same resistance value R with respect to gate bias resistors) on a semiconductor substrate under the same design rule as that of FIG. 8. Note that the same elements are indicated with the same reference numerals in FIGS. 6, 8, and 9.

As can be seen from comparison between FIGS. 5 and 9, if a multigate FET is adopted instead of a plurality of FETs connected in series, the chip size of a radio-frequency switch circuit can be reduced by about 10%. In addition, as can be seen from comparison between FIGS. 8 and 9, the areas of the gate bias resistor 231 to 238 and 241 to 248 of the radio-frequency switch circuit 200 are smaller by about 20% than those of the conventional radio-frequency switch circuit. Therefore, by using the radio-frequency switch circuit 200, the chip size can be reduced by about 30% from that of the conventional radio-frequency switch circuit (a vertical width H is reduced).

As described above, in the radio-frequency switch circuit 200 of the second embodiment of the present invention, concerning the resistance values of a plurality of gate bias resistors connected to a plurality of gate electrodes of a multiage FET, only a gate bias resistor connected to a gate electrode closest to an input/output terminal to which a radio-frequency signal is input is set to be a highest value. Thereby, the radio-frequency switch circuit 200 of the second embodiment of the present invention can have a significantly reduced footprint (chip size) on a semiconductor substrate while keeping the same performance as that of conventional radio-frequency switch circuits.

In the first and second embodiments of the present invention, a structure composed of a combination of two transfer circuits and two shunt circuits has been described. Alternatively, these transfer circuits and shunt circuits can be each caused to independently function as a switch circuit as described below.

Figure 10B:
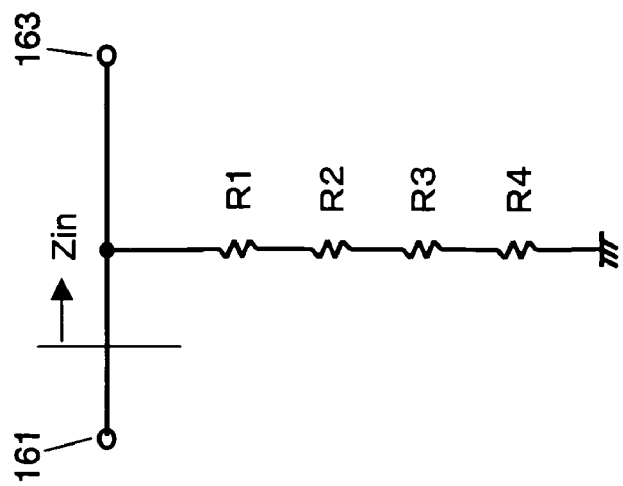
FIG. 10B is an equivalent circuit diagram illustrating the radio-frequency switch circuit 300 when FETs are in the ON state.
Figure 10A:
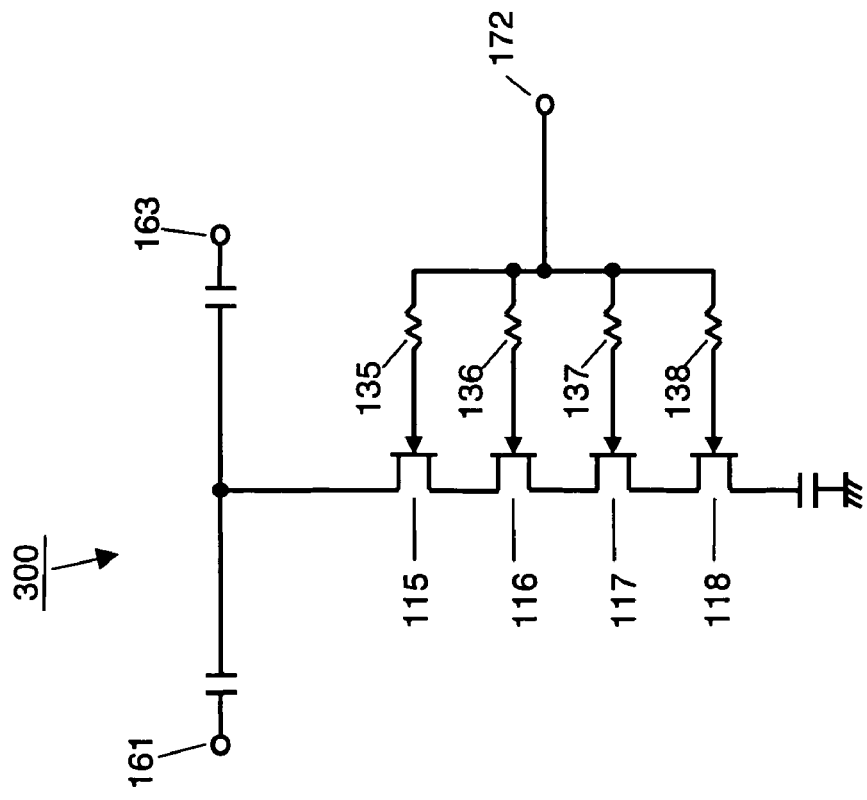
FIG. 10A is a diagram illustrating an exemplary radio-frequency switch circuit 300 composed of only a shunt circuit.

FIG. 10A illustrates an exemplary radio-frequency switch circuit 300 composed of only a shunt circuit. In the radio-frequency switch circuit 300, in order to transfer a radio-frequency signal from the input/output terminal 161 to the input/output terminal 163, the FETs 115 to 118 are turned OFF by applying a negative voltage to the control terminal 172. Conversely, in order not to transfer a radio-frequency signal from the input/output terminal 161 to the input/output terminal 163, the FETs 115 to 118 are turned ON by applying a voltage of 0 V to the control terminal 172. FIG. 10B is an equivalent circuit diagram illustrating the radio-frequency switch circuit 300 when the FETs 115 to 118 are in the ON state. By setting ON-resistances R1 to R4 of the FETs 115 to 118 to be sufficiently small values, an input impedance Zin of the circuit viewed from the input/output terminal 161 can be short-circuited. For example, if a characteristic impedance is 50Ω, the radio-frequency signal input from the input/output terminal 161 is totally reflected due to impedance mismatch, and is not transferred to the input/output terminal 163. Thus, signal transfer can be switched.

Figure 11B:
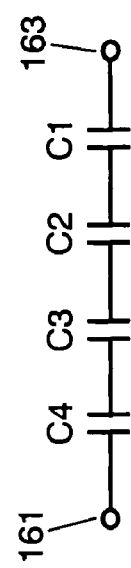
FIG. 11B is an equivalent circuit diagram illustrating the radio-frequency switch circuit 400 when FETs are in the OFF state.
Figure 11A:
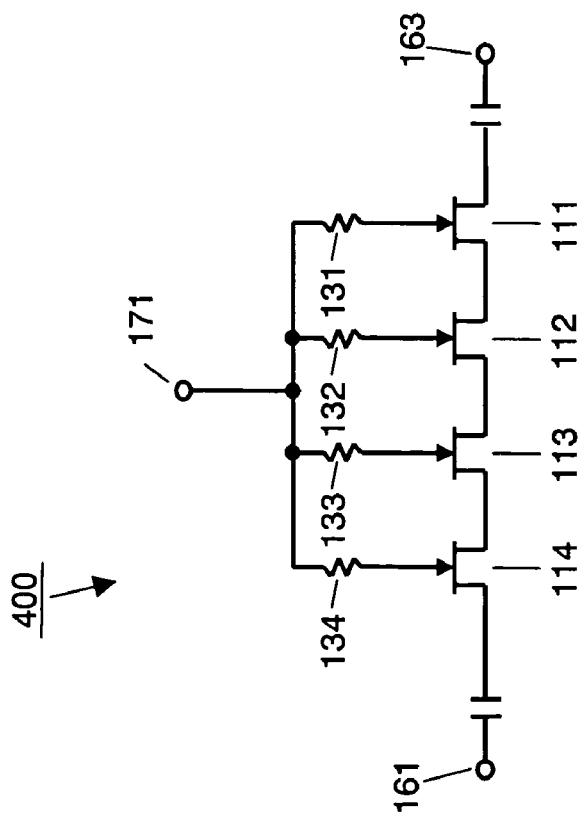
FIG. 11A is a diagram illustrating an exemplary radio-frequency switch circuit 400 composed of only a transfer circuit.
Figure 12:
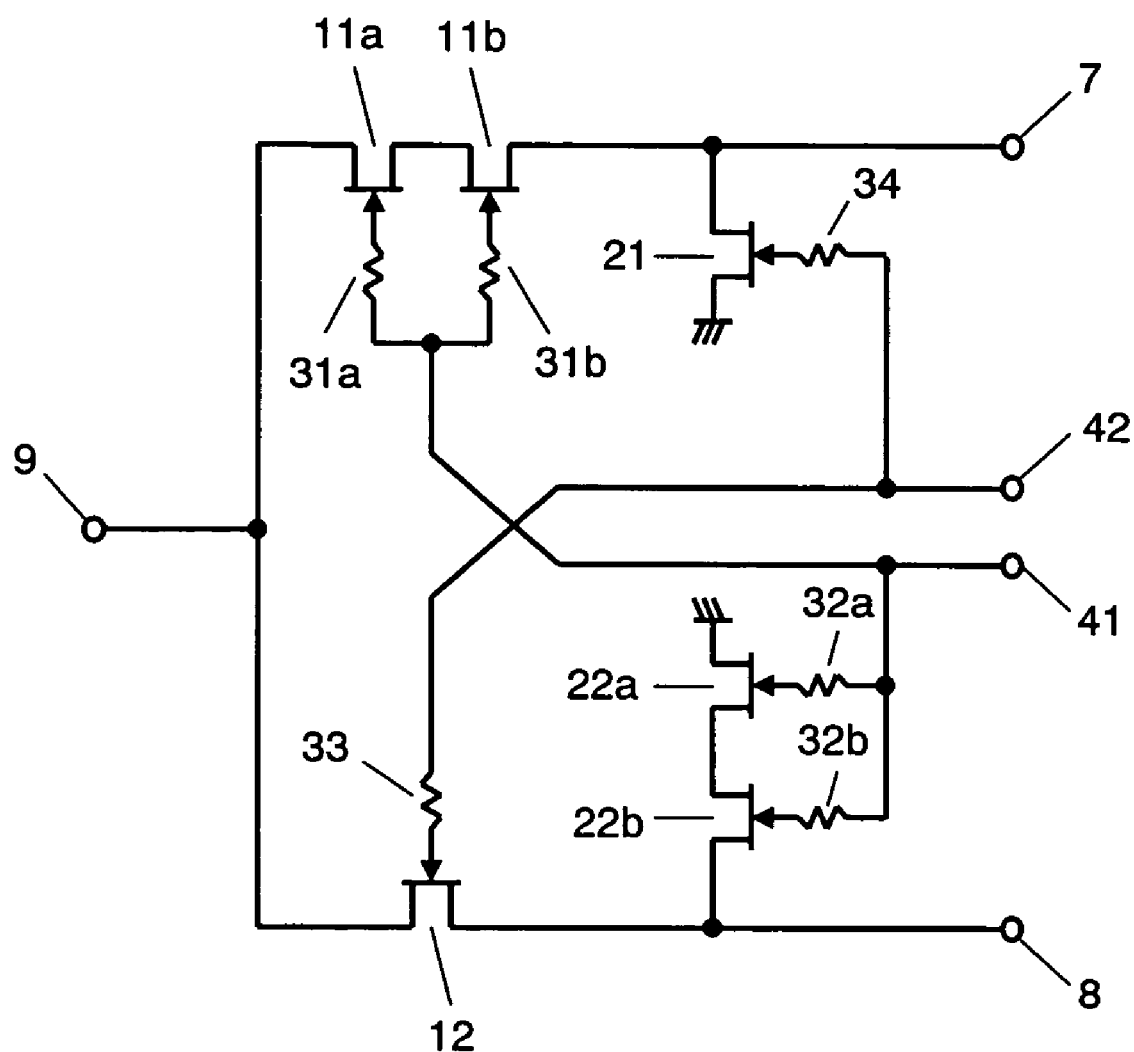
FIGS. 12 and 13 are diagrams illustrating a conventional radio-frequency switch circuit.
Figure 13:
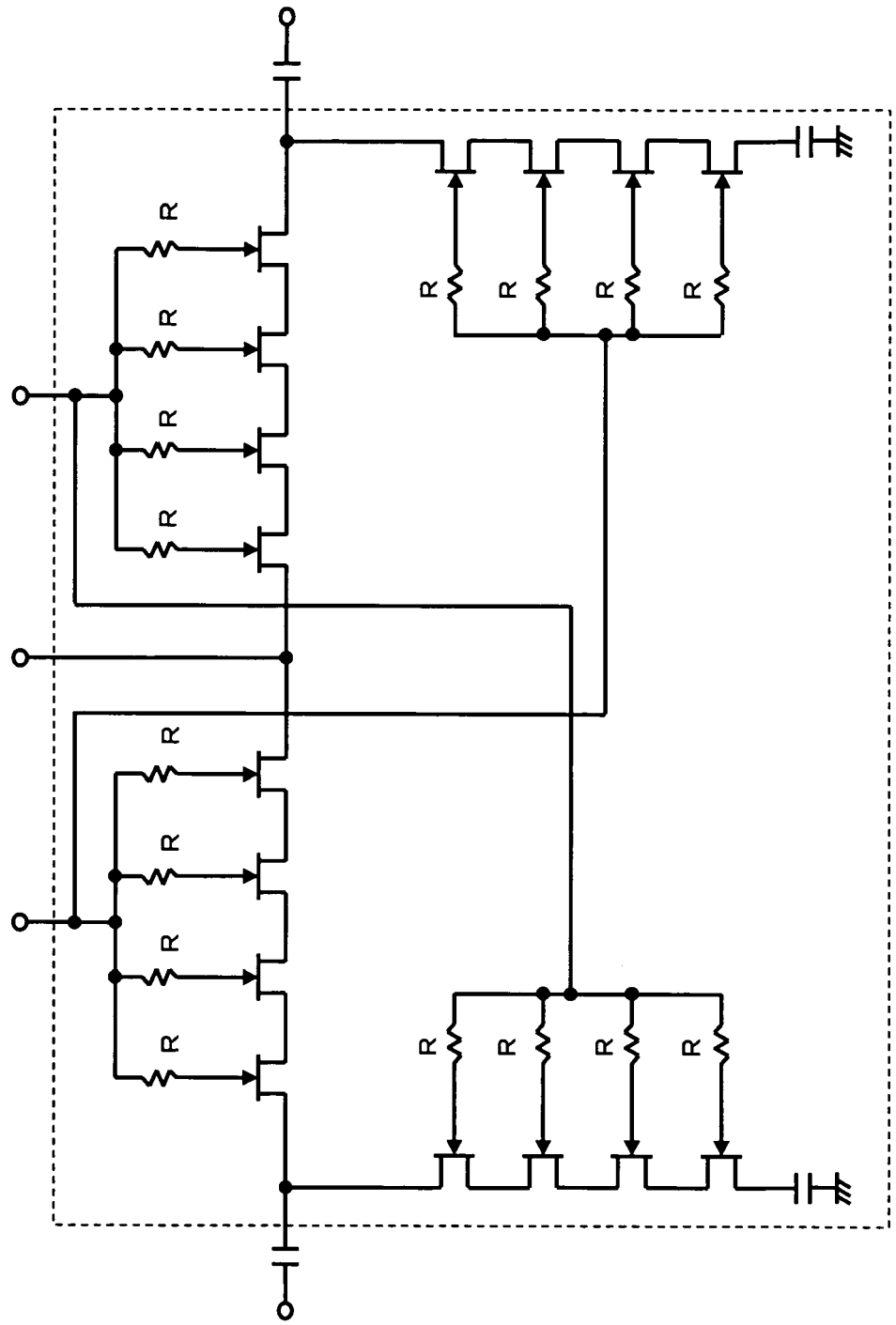

FIG. 11A illustrates an exemplary radio-frequency switch circuit 400 composed of only a transfer circuit. In the radio-frequency switch circuit 400, in order to a radio-frequency signal from the input/output terminal 161 to the input/output terminal 163, the FETs 111 to 114 are turned ON by applying a voltage of 0 V to the control terminal 171. Conversely, in order not to a radio-frequency signal from the input/output terminal 161 to the input/output terminal 163, the FETs 111 to 114 are turned OFF by applying a negative voltage to the control terminal 171.

FIG. 11B is an equivalent circuit diagram illustrating the radio-frequency switch circuit 400 when the FETs 111 to 114 are in the OFF state. By setting OFF-capacitances C1 to C4 of the FETs 111 to 114 to be sufficiently small values, transfer from the input/output terminal 161 to the input/output terminal 163 can be controlled, thereby making it possible to switch signal transfer.

Note that the radio-frequency switch circuits 300 and 400 may be composed of multigate FETs.

While the invention has been described in detail, the foregoing description is in all aspects illustrative and not restrictive. It is understood that numerous other modifications and variations can be devised without departing from the scope of the invention.

What is claimed is:

1. A radio-frequency switch circuit for controlling flow of a radio-frequency signal, comprising:
    a plurality of field-effect transistors inserted between an input/output terminal and a ground terminal and connected in series, a radio-frequency signal being input and output through the input/output terminal; and
    a plurality of resistance elements, wherein each of the plurality of resistance elements has two terminals, one of the two terminals is connected to a gate electrode of a corresponding one of the plurality of field-effect transistors, and a control voltage for switching an ON state and an OFF state of the corresponding field-effect transistor is applied to the other of the two terminals,
    wherein one of the plurality of resistance elements connected to a gate electrode of one of the plurality of field-effect transistors connected to the input/output terminal has a highest resistance value among the plurality of resistance elements, and wherein:
    first to n-th (n is an integer of 2 or more) field-effect transistors are connected in series and in order of first to n-th between from the input/output terminal to the ground terminal; and
    resistance values $Rgs(1)$ to $Rgs(n)$ of first to n-th resistance elements connected to gate electrodes of the first to n-th field-effect transistors are set based on the following expression:

$Rgs(1)>Rgs(2)\geq \ldots \geq Rgs(n-1)\geq Rgs(n)$.

2. A semiconductor device in which the radio-frequency switch circuit according to claim 1 is integrated on a semiconductor substrate.

3. A radio-frequency switch circuit for controlling flow of a radio-frequency signal, comprising:
    a plurality of field-effect transistors inserted between two input/output terminals and connected in series, a radio-frequency signal being input and output through the input/output terminals; and
    a plurality of resistance elements, wherein each of the plurality of resistance elements has two terminals, one of the two terminals is connected to a gate electrode of a corresponding one of the plurality of field-effect transistors, and a control voltage for switching an ON state and an OFF state of the corresponding field-effect transistor is applied to the other of the two terminals,
    wherein one of the plurality of resistance elements connected to a gate electrode of one of the plurality of field-effect transistors connected to an OFF active input/output terminal has a highest resistance value among the plurality of resistance elements, the OFF active input/output terminal being one of the two input/output terminals to which signal power is input when the plurality of field-effect transistors are in an OFF state, and wherein:
    first to m-th (m is an integer of 2 or more) field-effect transistors are connected in series and in order of first to m-th between from the OFF active input/output terminal to the other input/output terminal; and
    resistance values $Rg(1)$ to $Rg(m)$ of first to m-th resistance elements connected to gate electrodes of the first to m-th field-effect transistors are set based on the following expression:

$Rg(1)>Rg(2)\geq \ldots \geq Rg(m-1)\geq Rg(m)$.

4. A semiconductor device in which the radio-frequency switch circuit according to claim 3 is integrated on a semiconductor substrate.

5. A radio-frequency switch circuit for controlling flow of a radio-frequency signal, comprising:
    a multigate field-effect transistor inserted between an input/output terminal and a ground terminal, a radio-frequency signal being input and output through the input/output terminal; and
    a plurality of resistance elements, wherein each of the plurality of resistance elements has two terminals, one of the two terminals is connected to a corresponding gate electrode of the multigate field-effect transistor, and a control voltage for switching an ON state and an OFF state of the multigate field-effect transistor is applied to the other of the two terminals,
    wherein one of the plurality of resistance elements connected to a gate electrode closest to the input/output terminal has a highest resistance value among the plurality of resistance elements, and wherein:
    the multigate field-effect transistor has first to n-th (n is an integer of 2 or more) gate electrodes arranged in order of first to n-th between from the input/output terminal to the ground terminal; and
    resistance values $Rgs(1)$ to $Rgs(n)$ of first to n-th resistance elements connected to the first to n-th gate electrodes of the multigate field-effect transistor are set based on the following expression:

$Rgs(1)>Rgs(2)\geq \ldots \geq Rgs(n-1)\geq Rgs(n)$.

6. A semiconductor device in which the radio-frequency switch circuit according to claim 5 is integrated on a semiconductor substrate.

7. A radio-frequency switch circuit for controlling flow of a radio-frequency signal, comprising:
    a multigate field-effect transistor inserted between two input/output terminals, a radio-frequency signal being input and output through the input/output terminals; and
    a plurality of resistance elements, wherein each of the plurality of resistance elements has two terminals, one of the two terminals is connected to a corresponding gate electrode of the multigate field-effect transistor, and a control voltage for switching an ON state and an OFF state of the multigate field-effect transistor is applied to the other of the two terminals,
    wherein one of the plurality of resistance elements connected to a gate electrode closest to an OFF active input/output terminal has a highest resistance value among the plurality of resistance elements, the OFF active input/output terminal being one of the two input/output terminals to which signal power is input when the multigate field-effect transistor is in an OFF state, and wherein:
    the multigate field-effect transistor has first to m-th (m is an integer of 2 or more) gate electrodes arranged in order of first to m-th between from the OFF active input/output terminal to the other input/output terminal; and resistance values Rg(1) to Rg(m) of first to m-th resistance elements connected to the first to m-th gate electrodes of the multigate field-effect transistor are set based on the following expression:

$$Rg(1) > Rg(2) \geq \ldots \geq Rg(m-1) \geq Rg(m).$$

8. A semiconductor device in which the radio-frequency switch circuit according to claim 7 is integrated on a semiconductor substrate.

9. A radio-frequency switch circuit for controlling flow of a radio-frequency signal, comprising:
a plurality of field-effect transistors A inserted between a first input/output terminal and a third input/output terminal and connected in series, a radio-frequency signal being input and output through the first input/output terminal and the third input/output terminal;
a plurality of field-effect transistors B inserted between a second input/output terminal and the third input/output terminal and connected in series, a radio-frequency signal being input and output through the second input/output terminal;
a plurality of field-effect transistors C inserted between the first input/output terminal and a ground terminal and connected in series;
a plurality of field-effect transistors D inserted between the second input/output terminal and a ground terminal and connected in series;
a plurality of resistance elements A, wherein each of the plurality of resistance elements A has two terminals, one of the two terminals is connected to a gate electrode of a corresponding one of the plurality of field-effect transistors A, and a first control voltage for switching an ON state and an OFF state of the corresponding field-effect transistor A is applied to the other of the two terminals;
a plurality of resistance elements B, wherein each of the plurality of resistance elements B has two terminals, one of the two terminals is connected to a gate electrode of a corresponding one of the plurality of field-effect transistors B, and a second control voltage for switching an ON state and an OFF state of the corresponding field-effect transistor B is applied to the other of the two terminals;
a plurality of resistance elements C, wherein each of the plurality of resistance elements C has two terminals, one of two terminals is connected to a gate electrode of a corresponding one of the plurality of field-effect transistors C, and the second control voltage for switching an ON state and an OFF state of the corresponding field-effect transistor C is applied to the other of the two terminals; and
a plurality of resistance elements D, wherein each of the plurality of resistance elements D has two terminals, one of the two terminals is connected to a gate electrode of a corresponding one of the plurality of field-effect transistors D, and the first control voltage for switching an ON state and an OFF state of the corresponding field-effect transistor D is applied to the other of the two terminals;
wherein one of the plurality of resistance elements A connected to a gate electrode of one of the plurality of field-effect transistors A connected to the third input/output terminal has a highest resistance value among the plurality of resistance elements A,
one of the plurality of resistance elements B connected to a gate electrode of one of the plurality of field-effect transistors B connected to the third input/output terminal has a highest resistance value among the plurality of resistance elements B,
one of the plurality of resistance elements C connected to a gate electrode of one of the plurality of field-effect transistors C connected to the first input/output terminal has a highest resistance value among the plurality of resistance elements C, and
one of the plurality of resistance elements D connected to a gate electrode of one of the plurality of field-effect transistors D connected to the second input/output terminal has a highest resistance value among the plurality of resistance elements D.

10. The radio-frequency switch circuit according to claim 9, wherein:
first to m-th (m is an integer of 2 or more) field-effect transistors A are connected in series and in order of first to m-th between from the third input/output terminal to the first input/output terminal;
first to m-th field-effect transistors B are connected in series and in order of first to m-th between from the third input/output terminal to the second input/output terminal;
first to n-th (n is an integer of 2 or more) field-effect transistors C are connected in series and in order of first to n-th between from the first input/output terminal to a ground terminal;
first to n-th field-effect transistors D are connected in series and in order of first to n-th between from the second input/output terminal to a ground terminal;
resistance values Rg(1) to Rg(m) of first to m-th resistance elements A connected to gate electrodes of the first to m-th field-effect transistors A and resistance values Rg(1) to Rg(m) of first to m-th resistance elements B connected to gate electrodes of the first to m-th field-effect transistors B are set based on expression 1 below; and
resistance values Rgs(1) to Rgs(n) of first to n-th resistance elements C connected to gate electrodes of the first to n-th field-effect transistors C and resistance values Rgs(1) to Rgs(n) of first to n-th resistance elements D connected to gate electrodes of the first to n-th field-effect transistors D are set based on expression 2 below, $$Rg(1) > Rg(2) \geq \ldots \geq Rg(m-1) \geq Rg(m) \qquad \text{expression 1}$$

$$Rgs(1) > Rgs(2) \geq \ldots \geq Rgs(n-1) \geq Rgs(n) \qquad \text{expression 2.}$$

11. A semiconductor device in which the radio-frequency switch circuit according to claim 10 is integrated on a semiconductor substrate.

12. A semiconductor device in which the radio-frequency switch circuit according to claim 9 is integrated on a semiconductor substrate.

13. A radio-frequency switch circuit for controlling flow of a radio-frequency signal, comprising:
a multigate field-effect transistor A inserted between a first input/output terminal and a third input/output terminal, a radio-frequency signal being input and output through the first input/output terminal and the third input/output terminal;
a multigate field-effect transistor B inserted between a second input/output terminal and the third input/output terminal, a radio-frequency signal being input and output through the second input/output terminal;
a multigate field-effect transistor C inserted between the first input/output terminal and a ground terminal;
a multigate field-effect transistor D inserted between the second input/output terminal and a ground terminal;
a plurality of resistance elements A, wherein each of the plurality of resistance elements A has two terminals, one of the two terminals is connected to a corresponding gate electrode of the multigate field-effect transistor A, and a first control voltage for switching an ON state and an OFF state of the multigate field-effect transistor A is applied to the other of the two terminals;

a plurality of resistance elements B, wherein each of the plurality of resistance elements B has two terminals, one of the two terminals is connected to a corresponding gate electrode of the multigate field-effect transistor B, and a second control voltage for switching an ON state and an OFF state of the multigate field-effect transistor B is applied to the other of the two terminals;

a plurality of resistance elements C, wherein each of the plurality of resistance elements C has two terminals, one of the two terminals is connected to a corresponding gate electrode of the multigate field-effect transistor C, and the second control voltage for switching an ON state and an OFF state of the multigate field-effect transistor C is applied to the other of the two terminals; and a plurality of resistance elements D, wherein each of the plurality of resistance elements D has two terminals, and one of the two terminals is connected to a corresponding gate electrode of the multigate field-effect transistor D, and the first control voltage for switching an ON state and an OFF state of the multigate field-effect transistor D is applied to the other of the two terminals, wherein one of the plurality of resistance elements A connected to one gate electrode of the multigate field-effect transistor A closest to the third input/output terminal has a highest resistance value among the plurality of resistance elements A, one of the plurality of resistance elements B connected to one gate electrode of the multigate field-effect transistor B closest to the third input/output terminal has a highest resistance value among the plurality of resistance elements B, one of the plurality of resistance elements C connected to one gate electrode of the multigate field-effect transistor C closest to the first input/output terminal has a highest resistance value among the plurality of resistance elements C, and one of the plurality of resistance elements D connected to one gate electrode of the multigate field-effect transistor D closest to the second input/output terminal has a highest resistance value among the plurality of resistance elements D.

14. The radio-frequency switch circuit according to claim 13, wherein:

the multigate field-effect transistor A has first to m-th (m is an integer of 2 or more) gate electrodes arranged in order of first to m-th between from the third input/output terminal to the first input/output terminal;

the multigate field-effect transistor B has first to m-th gate electrodes arranged in order of first to m-th between from the third input/output terminal to the second input/output terminal;

the multigate field-effect transistor C has first to n-th (n is an integer of 2 or more) gate electrodes arranged in order of first to n-th between from the first input/output terminal to a ground terminal;

the multigate field-effect transistor D has first to n-th gate electrodes arranged in order of first to n-th between from the second input/output terminal to a ground terminal;

resistance values $Rg(1)$ to $Rg(m)$ of first to m-th resistance elements A connected to the first to m-th gate electrodes of the multigate field-effect transistor A and resistance values $Rg(1)$ to $Rg(m)$ of first to m-th resistance elements B connected to the first to m-th gate electrodes of the multigate field-effect transistor B are set based on expression 1 below; and resistance values $Rgs(1)$ to $Rgs(n)$ of first to n-th resistance elements C connected to the first to n-th gate electrodes of the multigate field-effect transistor C and resistance values $Rgs(1)$ to $Rgs(n)$ of first to n-th resistance elements D connected to the first to n-th gate electrodes of the multigate field-effect transistor D are set based on expression 2 below, $$Rg(1) > Rg(2) \geq \ldots \geq Rg(m-1) \geq Rg(m) \qquad \text{expression 1}$$

$$Rgs(1) > Rgs(2) \geq \ldots \geq Rgs(n-1) \geq Rgs(n) \qquad \text{expression 2.}$$

15. A semiconductor device in which the radio-frequency switch circuit according to claim 14 is integrated on a semiconductor substrate.

16. A semiconductor device in which the radio-frequency switch circuit according to claim 13 is integrated on a semiconductor substrate.

* * * * *